United States Patent [19]

Kitagawa et al.

[11] Patent Number: 4,903,169
[45] Date of Patent: Feb. 20, 1990

[54] SHIELDED HIGH FREQUENCY APPARATUS HAVING PARTITIONED SHIELD CASE, AND METHOD OF MANUFACTURE THEREOF

[75] Inventors: Motoyoshi Kitagawa, Aichi; Kohei Tanaka, Gifu; Toao Ishida, Aichi; Kenzo Ito, Osaka, Japan

[73] Assignee: Matsushita Electric Industrial Co., Ltd., Osaka, Japan

[21] Appl. No.: 246,058

[22] Filed: Sep. 19, 1988

[30] Foreign Application Priority Data

Apr. 3, 1986 [JP] Japan ................................. 61-48952

[51] Int. Cl.$^4$ ............................................... H05K 9/00
[52] U.S. Cl. ...................................... 361/424; 29/840; 29/841; 228/215; 361/399
[58] Field of Search ............ 29/840, 841; 174/35 MS, 174/35 GC, 35 R, 51, 94 R; 228/215; 361/380, 395, 399, 422, 424

[56] References Cited

U.S. PATENT DOCUMENTS 4,404,617  9/1983  Ohyama et al. .................. 174/35 R
4,626,963 12/1986  Speer ............................... 174/35 R
4,717,990  1/1988  Tugen ............................... 361/424

Primary Examiner—Gregory P. Thompson
Attorney, Agent, or Firm—Pollock, VandeSande & Priddy

[57] ABSTRACT

A shielded high-frequency apparatus has a partitioned shielding case with a printed circuit board mounted therein. The partitioned shielding case is formed of a plurality of mutually intersecting shield plates which are attached within a frame to form a plurality of shield chambers. The partitioned shielding case is manufactured by first forming a solder resist film over the partitioned plate surfaces other than at specific end regions of the partition plates and over the frame internal surface other than at positions immediately adjacent to the end regions of the partition plates when the partitioned shielding case is assembled. The partition plates are then mounted in the frame, solder is next applied to the regions from which the solder resist film was omitted. Secure attachment of the partition plates and ease of implementation of automatic manufacture are attained, with reduced manufacturing costs.

15 Claims, 2 Drawing Sheets

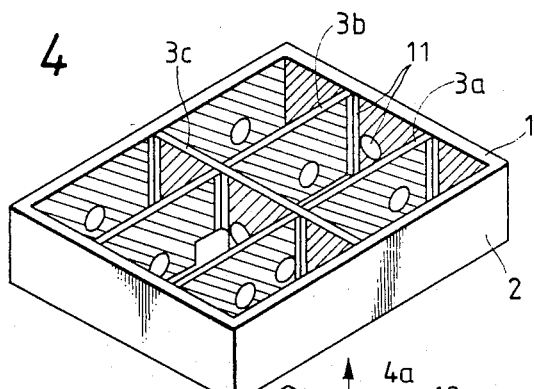
FIG. 4
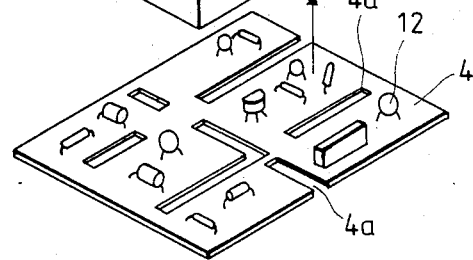
FIG. 5
FIG. 6
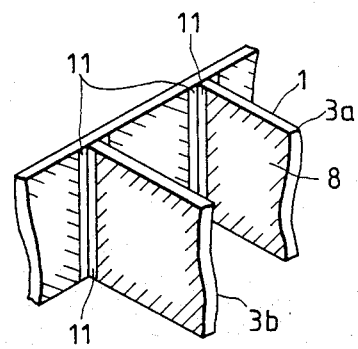
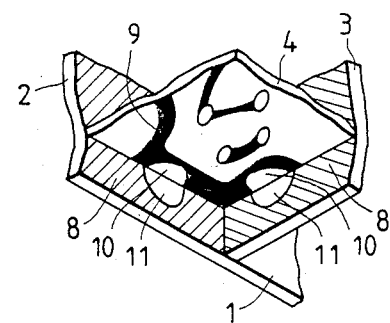
FIG. 7
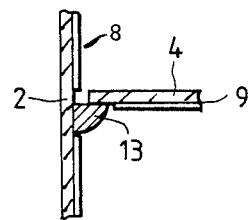
FIG. 8
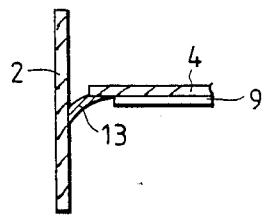

SHIELDED HIGH FREQUENCY APPARATUS HAVING PARTITIONED SHIELD CASE, AND METHOD OF MANUFACTURE THEREOF

BACKGROUND OF THE INVENTION

The present invention relates to a shielded high-frequency apparatus having a partitioned shielding case, and a method of manufacturing such apparatus. More specifically, the present invention is directed towards a shielded high-frequency apparatus consisting of a partitioned shielding case having a printed circuit board mounted therein, with partitions of the case forming chambers for mutually isolating portions of the printed circuit board.

Such a shielded high-frequency apparatus is widely utilized at the present time to implement a high frequency receiver circuit operating in the UHF band, for use in a CATV system for example, in which the effects of radio wave interference must be suppressed.

FIG. 1 is an oblique view of a prior art shielded high-frequency apparatus of this type, which consists of a partitioned shielding case 1 and a printed circuit board 4, with the diagram showing the condition prior to inserting the printed circuit board 4 into the partitioned shielding case 1 to be attached therein as described hereinafter. FIG. 2 shows a junction between one of a set of three partition plates 3a, 3b and 3c and a frame 2 of the partitioned shielding case 1, whereby the partition plate is attached to the inner face of the frame 2 while in addition electrical shielding is established at the junction, while FIG. 3 shows a junction between the printed circuit board 4, a separate metal attachment member 6 which serves to attach the printed circuit board 4 to the frame 2, and the inner face of the frame 2. A plurality of such separate metal attachment members may be utilized.

The frame 2 is formed from metal plate in a rectangular shape as shown. The term "metal plate" as used in the present specification and claims signifies metal in thin, flat form, and is intended to apply to material such as sheet metal. The partition plates 3a, 3b and 3c are also formed from metal plate, and serve to partition the interior of the frame 2 as a shielding function. The printed circuit board 4 has electrical components 12 mounted thereon.

As shown in FIG. 2, a material 5 is disposed to provide a shield at each of the junctions between the partition plates 3a, 3b and 3c and the frame 2, and also to mutually attach the partition plates 3a, 3b and 3c and the frame 2. Such material is also disposed for shielding the junctions at which the partition plates 3a, 3b and 3c mutually intersect as shown in FIG. 1, and to mutually attach the partition plates 3a, 3b and 3c.

The separate metal attachment member 6 is provided with lugs 6' which are utilized for solder attachment of the separate metal attachment member 6 to both the partitioned shielding case 1 and to a portion of a printed circuit pattern on the printed circuit board 4 that is to be at ground potential, to thereby attach the printed circuit board 4 to the partitioned shielding case 1 and also establish electrical ground connection between these.

This prior art apparatus is assembled as follows. First, the two laterally extending partition plates 3a and 3b and the vertically extending partition plate 3c (as viewed in plan) are inserted in the frame 2, and the junction portions between these partition plates 3a, 3b and 3c and the inner face of the frame 2, and between the intersections of the partition plates 3a, 3b and 3c, are mutually attached by the shielding material 5. The shielding material 5 generally consists of copper foil, which is brazed in order to establish the aforesaid attachment. However in some cases solder may be used. Irrespective of the type of shielding material which is used, manual operations must be executed in order to establish the mutual attachments described above.

The printed circuit board 4 is then inserted into the frame 2, and then is attached to the partitioned shielding case 1 and also electrically connected to the partitioned shielding case 1 (i.e. connection between a ground lead pattern of the printed circuit board 4 and the partitioned shielding case 1) by soldering the lugs 6' of the separate metal attachment member 6 as shown in FIG. 3. This soldering operation is performed manually, using solder 7 which has been deposited on the lugs 6'.

Such a prior art shielded high-frequency apparatus presents the following problems. First, if copper foil is used as the shield material 5, then high-temperature copper brazing must be carried out. This can result in warping of the partitioned shielding case 1. In addition, plating processing may be necessary after completion of such copper brazing, so that the manufacturing cost of such a shielded high-frequency apparatus will be high and the dimensional accuracy will be poor.

If on the other hand solder is used as the shield material 5, then it is necessary to perform deposition of solder on the frame 2 beforehand, by solder plating. This may result in excess amounts of solder being left deposited on the frame 2, or extraneous fringes or spikes of excess solder may be formed, making it necessary to remove the excess solder, e.g. by a process such as immersing the frame 2 in oil. In addition to the above problems, such a method results in large quantities of solder being utilized in the manufacturing process.

Furthermore when the printed circuit board 4 and the partitioned shielding case 1 are mutually attached by soldering using the separate metal attachment member 6, there is a danger that "dry joints" may be produced in the solder connections, so that lower reliability may occur. Moreover when the printed circuit board 4 and the partitioned shielding case 1 are mutually attached by such a separate metal attachment member 6 having solder lugs 6' as in this example, it will in fact be necessary to use a plurality of such separate attachment members.

SUMMARY OF THE INVENTION

It is an objective of the present invention to provide a shielded high-frequency apparatus and method of manufacturing such a shielded high-frequency apparatus, whereby the problems of the prior art described above are eliminated. More specifically, it is an objective of the present invention to provide a shielded high-frequency apparatus whereby the use of unnecessarily large amounts of solder during solder attachment of a frame to partition plates of a partitioned shielding case of the apparatus is eliminated, thereby enhancing overall quality and reliability of the final product, and reducing manufacturing costs, and furthermore whereby a printed circuit board can be reliably attached within a partitioned shielding case of the apparatus by soldering. It is moreover an objective to provide such a shielded high-frequency apparatus and method of manufacture whereby all solder attachment and electrical connection operations which are executed during manufacture, including interconnections of electrical components of a printed circuit board of the apparatus, can be implemented by automatic means, with no manual intervention being necessary.

In order to achieve the above objectives for a shielded high-frequency apparatus, following steps are taken; Prior to deposition of solder for attaching a frame to a set of partition plates and mutually attaching the partition plates to thereby form a partitioned shielding case, and prior to attaching a printed circuit board within the partitioned shielding case, an interior surface of the frame, as well as surfaces of the partition plates, are coated with a solder resist film. The solder resist film is omitted from regions of the frame surface disposed adjacent to junctions between the frame and the partition plates, and from regions of the partition plates at which the partition plates mutually intersect. In this way, when solder is subsequently applied, the solder is deposited only at positions in which it is actually necessary for attachment of the partition plates to the frame, mutual attachment of the partition plates, and attachment of the printed circuit board to the partitioned shielding case formed by the frame and the partition plates. When solder is then formed on the regions of the frame, partition plates and printed circuit board which have been left free from coating by the solder resist film, unnecessary deposition of excessive amounts of solder is thereby prevented.

The method of the invention further permits simultaneously solder attachment of the printed circuit board to the partitioned shielding case with soldering of printed circuit board components to the printed circuit board circuit pattern, simply by partial immersion in a solder bath, so that the manufacturing process is substantially simplified by comparison with the prior art.

BRIEF DESCRIPTION OF THE DRAWINGS

FIG. 4 is an oblique external view of an embodiment of a shielded high-frequency apparatus according to the present invention, showing a partitioned shielding case and a printed circuit board prior to insertion in the partitioned shielding case;

FIG. 5 is a partial oblique view illustrating junctions between two intersecting partition plates of the embodiment of FIG. 4;

FIG. 6 is a partial oblique view illustrating attachment of the printed circuit board to the partitioned shielding case in the embodiment of FIG. 5;

FIG. 7 is a partial cross-sectional view in elevation to illustrate attachment of the partitioned shielding case to the frame of the partitioned shielding case in the embodiment of FIG. 4; and FIG. 8 is a partial cross-sectional view in elevation showing attachment of the partitioned shielding case to the frame of the partitioned shielding case in the embodiment of FIG. 4, to illustrate the adverse effects resulting if a solder resist film is not formed on the frame prior to

DESCRIPTION OF PREFERRED EMBODIMENT

Figure 1:
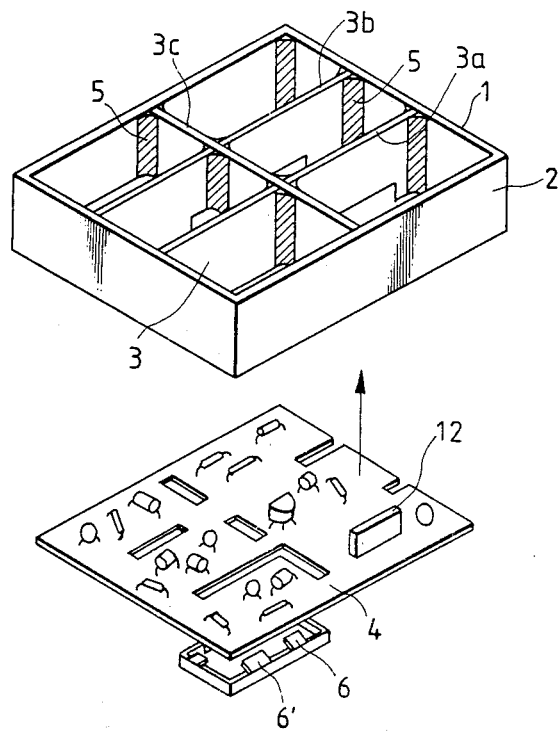
FIG. 1 is an oblique external view of a prior art shielded high-frequency apparatus having a partitioned shielding case and a printed circuit board prior to insertion in the partitioned shielding case.
Figure 2:
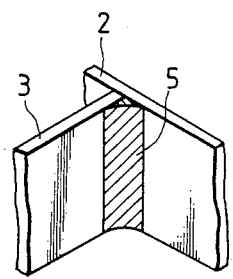
FIG. 2 is an oblique view illustrating a junction between a partition plate and a frame of the partitioned shielding case of FIG. 1.
Figure 3:
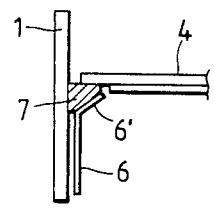
FIG. 3 is a plan view showing a junction at which a printed circuit board is attached to the partitioned shielding case by a separate metal attachment member.

FIG. 4 is an oblique view of a partitioned shielding case and printed circuit board of an embodiment of a shielded high-frequency apparatus according to the present invention, showing the printed circuit board prior to insertion within the partitioned shielding case. Components corresponding to those of the prior art example of FIG. 1 are indicated by corresponding reference numerals. The interior surface of the frame 2 of the partitioned shielding case 1 of this embodiment is coated with a solder resist film 8 prior to assembly of the apparatus, with coating of the solder resist film being omitted at specific regions 11 of the inner surface of the frame 2 which have been predetermined for attachment of the printed circuit board 4 to the frame 2 by soldering as described hereinafter. The ground pattern 9 of the printed circuit board 4 (i.e. the portion of the connecting lead pattern formed on the lower surface of the printed circuit board 4 that is to be connected to ground potential), formed from a copper layer, is also coated with a solder resist film 8, with this coating being omitted in specific regions 10 of that ground pattern, disposed immediately adjacent to the periphery of the printed circuit board 4, which are to be positioned immediately adjacent to corresponding ones of the aforementioned regions of the frame 2 inner surface from which coating with the solder resist film has been omitted. The positional relationships between these non-coated regions 11 of the inner face of the frame 2 and the peripheral non-coated regions 10 of the ground lead pattern of the printed circuit board 4 are illustrated in the partial oblique view of FIG. 6, in which the printed circuit board 4 is viewed from below.

The partition plates 3a, 3b and 3c, as for example illustrated collectively by a partition plate 3 in FIG. 6, are also coated with a solder resist film 8 prior to assembly of the apparatus, and during this coating processing, the solder resist film 8 is omitted from specific end regions 11 of the partition plates 3a, 3b and 3c as illustrated in FIG. 5, i.e. each of the end regions in which the partition plates 3a, 3b and 3c respectively come in contact with the inner face of the frame 2 when the partitioned shielding case is assembled as shown in FIG. 4. Corresponding regions 11 of that inner face of the frame 2 are also left uncoated by the solder resist film, i.e. regions which become closely adjacent to the aforementioned end portions of the partition plates 3a, 3b and 3c when the apparatus is assembled. In addition, regions of the surfaces of the partition plates which are closely adjacent to the respective axes of intersection of the partition plates when the apparatus is assembled, are also left uncoated with the solder resist film.

In this embodiment, centrally located slots are cut out of the lower halves of each of the horizontal (as viewed in plan) partition plates 3a, 3b, while two corresponding slots are cut out of the upper half of the vertical partition plate 3c, at positions such that the partition plates 3a, 3b and 3c can be fitted together as shown in FIG. 4 by lowering the partition plates 3a, 3b onto the partition plate 3c so that they mutually interlock in the configuration shown, within the frame 2, mutually perpendicularly intersecting along two axes. As stated above, the coating of the solder resist film 8 on the partition plates 3a, 3b and 3c is omitted at portions 11 of these plates respectively closely adjacent to the axes along which the plates mutually intersect when assembled in this interlocking configuration.

As for the prior art example described hereinabove, cut-out portions 4a are formed in the printed circuit board 4 to engage with correspondingly shaped portions of the partition plates 3a, 3b and 3c when the printed circuit board 4 is inserted into the partitioned shielding case 1.

The process of manufacturing such a shielded high-frequency apparatus is as follows. First, the printed circuit board 4, frame 2 and partition plates 3a, 3b and 3c are separately prepared, with solder resist film formed on these as described above, i.e. omitted from specific regions. Circuit components are inserted into the printed circuit board 4, but are left unsoldered. The partition plates 3a, 3b and 3c are then inserted into the frame 2 to fit together in a mutually perpendicular interlocking configuration within the case as shown in FIG. 4. The resultant assembly is then immersed in a solder bath, whereby the end portions of the partition plates 3a, 3b and 3c (i.e. the portions where no solder resist film was deposited) become soldered to the corresponding portions of the internal surface of the frame 2, and regions at the intersections of the partition plates 3a, 3b and 3c also become mutually soldered. The assembly is then removed from the solder bath and allowed to cool, leaving the partition plates 3a, 3b and 3c mutually fixedly attached by solder and also fixedly attached within the frame 2. The partitioned shielding case 1 is thus formed.

It will be noted that such a method has the advantage over the prior art method of copper brazing that the attachment of the partition plates 3a, 3b and 3c to the frame 2 can be executed by low-temperature processing, so that warping of the frame 2 and partition plates 3a, 3b and 3c due to high temperature brazing can be avoided. Greater dimensional accuracy for the partitioned shielding case 1 can thereby be attained. Furthermore due to the fact that the solder resist film 8 is formed over all regions of the frame 2 and partition plates 3a, 3b and 3c other than those where solder deposition is actually required, excessive deposition of solder and the formation of extraneous solder fringes or spikes is eliminated.

The printed circuit board 4 is then inserted into the partitioned shielding case 1 by upward movement as indicated in FIG. 1, to engage the cut-out portions of the printed circuit board 4 in the shaped lower portions of the partition plates 3a, 3b and 3c described above. The printed circuit board 4 is thereby left positioned within the partitioned shielding case 1 as shown in FIG. 6. The circuit board/case assembly is then lowered into a solder bath until the lower face of the printed circuit board 4 is immersed in the solder. Soldering of the connecting leads of the electronic components 12 on the printed circuit board 4 to the board circuit pattern is thereby accomplished, while at the same time, solder is deposited on the regions 11 of the internal face of the frame 2 and the corresponding portions 10 of the ground pattern of the printed circuit board 4, which have been left free from the solder resist film as described above. The printed circuit board 4 and frame 2 thereby become mutually attached, to firmly fix the printed circuit board 4 within the partitioned shielding case 1.

It should be noted that the formation of a patterned resist pattern on the inner face of the frame 2 and the ground pattern of the printed circuit board 4, in addition to resulting in a substantial reduction of the amount of solder required to attach the printed circuit board 4 to the partitioned shielding case 1, also results in a greatly increased reliability of solder connection between the printed circuit board 4 and partitioned shielding case 1 by comparison with a method in which such a coating of resist is not executed. This fact may not be immediately apparent, but is made clear by FIGS. 7 and 8. As shown in FIG. 7, the portion of solder that is left deposited covering each of the aforementioned mutually adjoining regions 10, 11 which have not been coated with resist will have a bulging, convex profile as viewed in cross-section. This is illustrated in FIG. 7. If however the solder resist film were to be omitted from the frame 2 surface, then the resultant formation of solder between the printed circuit board 4 ground pattern and the frame 2 surface would be as shown in FIG. 8. Here, the solder portion is formed with a substantially thinner cross-sectional area, which is shaped such that reliable attachment of the printed circuit board 4 to the frame 2 is not assured.

With the present embodiment, the frame 2 and the partition plates 3a, 3b and, 3c are respectively formed from solder-coated steel plates, for ease of manufacture and to ensure satisfactory adherence of solder.

The requisite patterns of solder resist film 8 on the frame 2 of this embodiment are formed by screen printing of the resist film onto a plurality of these components simultaneously while they are still in the flat metal plate condition, to improve productivity. To facilitate adherence of the solder resist film to the metal plate surfaces, these surfaces are subjected to roughening processing before screen printing of the solder resist film is performed.

It can be understood from the above that with a shielded high-frequency apparatus construction and method of manufacture according to the present invention, several advantages over the prior art are obtained, as follows:

(a) Solder is only deposited on regions of the frame and the partition plates where such deposition is actually required for attachment purposes, so that the amount of solder that is utilized is substantially less than is required in the prior art.

(b) All of the operations including soldering can be performed automatically, e.g. solder is executed simply by immersion in a solder bath. Thus, productivity is significantly increased by comparison with prior art methods of manufacturing such a shielded high-frequency apparatus.

(c) Since attachment of the partition plates to the frame is executed by soldering, only low temperature processing is necessary, i.e. the brazing that is generally utilized in the prior art is not required, so that warping of the frame and partition plates due to such high temperature processing is eliminated. The dimensional accuracy of the finished shielded high-frequency apparatus is thereby enhanced.

(d) Due to the fact that solder is only deposited in regions where it is actually required, it is not necessary to execute processing, e.g. in an oil bath, to remove excess solder in order to eliminate fringes or spikes formed by such excess solder. Production efficiency is thereby further enhanced.

(e) As described above referring to FIG. 8, due to the small sizes of the respective regions which are left uncoated with the solder resist film on the frame and the printed circuit board ground pattern, and the physical characteristics of molten solder, substantially stronger and more reliable attachment of the printed circuit board to the partitioned shielding case is attained than is possible by prior art methods which utilize solder for this attachment function.

What is claimed is:

1. In a shielded high-frequency apparatus comprising a frame formed of metal plate, a plurality of partition plates, respectively formed of metal plate, for partitioning the interior of said frame, and a printed circuit board mounted within said frame, the improvement comprising:

a solder resist film provided over at least an interior surface of said frame, and over respective surfaces of said partition plates, with said solder resist film being omitted from specific end regions of said partition plates, said specific end regions being positioned closely adjacent to said frame interior surface, said solder resist film being further omitted from specific regions of said frame interior surface which are respectively positioned closely adjacent to specific end regions of said partition plates and solder portions respectively provided on said partition plate end regions and said specific regions of said frame interior surface, for thereby attaching said partition plates to said frame.

2. A shielded high-frequency apparatus according to claim 1 in which said frame and said partition plates are respectively formed from solder-coated steel plates.

3. A shielded high-frequency apparatus according to claim 1, wherein, prior to being coated with solder resist, said frame and said partition plates have respective roughened surfaces.

4. In a shielded high-frequency apparatus comprising a frame formed of metal plate, a plurality of partition plates for partitioning the interior of said frame, said partition plates being respectively formed of metal plate arranged to mutually intersect perpendicularly along at least one specific axis, and a printed circuit board mounted within said frame, the improvement comprising:

a solder resist film provided over at least an interior surface of said frame, and over respective surfaces of said partition plates, with said solder resist film being omitted from specific end regions of said partition plates, said specific end regions being disposed immediately adjacent to said frame interior surface, and being omitted from surface regions of said partition plates disposed immediately adjacent to said at least one specific axis, said solder resist film being further omitted from specific regions of said frame interior surface which are positioned in correspondence with said specific end regions of said partition plates; and solder portions respectively provided on said specific end regions of said partition plates and said correspondingly positioned specific regions of said frame interior surface, for thereby attaching said partition plates to said interior surface, and solder portions provided on said surface regions of said partition plates adjacent said at least one specific axis for thereby mutually attaching said partition plates.

5. A shielded high-frequency apparatus according to claim 4, in which said frame and said partition plates are respectively formed from solder-coated steel plates.

6. A shielded high-frequency apparatus according to claim 4, wherein, prior to being coated with solder resist, said frame and said partition plates have respective roughened surfaces.

7. In a shielded high-frequency apparatus comprising a frame formed of metal plate, a plurality of partition plates, respectively formed of metal plate, for partitioning the interior of said frame, and a printed circuit board mounted within said frame and having a ground pattern formed as a patterned metal layer thereon, the improvement comprising:

a solder resist film provided over at least an interior surface of said frame, and over respective surfaces of said partition plates, with said solder resist film being omitted from specific end regions of said partition plates, said specific end regions being disposed immediately adjacent to said frame interior surface, said solder resist film being further omitted from specific regions of said frame interior surface which are positioned in correspondence with said specific end regions of said partition plates, said solder resist film being omitted from specific regions of said printed circuit board ground pattern disposed adjacent to the periphery of said printed circuit board and also omitted from specific regions of said frame interior surface positioned respectively corresponding and adjacent to said specific regions of the printed circuit board ground pattern; and solder portions respectively provided on said specific end regions of said partition plates and said correspondingly positioned specific regions of said frame interior surface, for thereby attaching said partition plates to said interior surface, and solder portions respectively provided on said printed circuit board ground pattern specific regions and on said corresponding specific regions of said frame internal surface, for thereby attaching said printed circuit board to said frame.

8. A shielded high-frequency apparatus according to claim 7 in which said frame and said partition plates are respectively formed from solder-coated steel plates.

9. A shielded high-frequency apparatus according to claim 8, wherein, prior to being coated with solder resist, said frame and said partition plates have respective roughened surfaces.

10. A method of manufacturing a shielded high-frequency apparatus having a partitioned shielding case and a printed circuit board mounted within said partitioned shielding case, comprising steps of:

(a) forming a frame and partition plates from plate metal;

(b) forming a solder resist film over an interior surface of said frame, with said solder resist film being omitted from a plurality of specific regions of said frame interior surface, and forming a solder resist film over surfaces of said partition plates, with said solder resist film being omitted from specific end regions of said partition plates;

(c) mounting said partition plates within said frame, with said end regions of said partition plates positioned immediately adjacent to respective ones of said specific regions of said frame interior surface; and (d) forming solder over said specific end regions of the partition plates and said specific regions of said frame interior surface, for thereby attaching said partition plates to said frame interior surface to thereby form said partitioned shielding case.

11. A method of manufacture according to claim 10, and further comprising a step of executing surface roughening processing of surfaces of said partition plates and said frame interior surface, prior to said step (b) of solder resist film formation.

12. A method of manufacturing a shielded high-frequency apparatus having a partitioned shielding case and a printed circuit board mounted within said partitioned shielding case, comprising steps of:
(a) forming a frame and at least two partition plates from plate metal;
(b) forming solder resist film over an interior surface of said frame, with said solder resist film being omitted from a plurality of specific regions of said frame interior surface, and forming a solder resist film over surfaces of said partition plates, with said solder resist film being omitted from specific end regions of said partition plates and from specific intermediate regions of said partition plates adjacent to at least an intersection axis where said partition plates mutually intersect perpendicularly;
(c) mounting said partition plates to mutually intersect perpendicularly within said frame, with said specific end regions of said partition plates being positioned immediately adjacent to respective ones of said specific regions of said frame interior surface; and
(d) forming solder over said specific end regions of said partition plates and said specific regions of said frame interior surface, for thereby attaching said partition plates to said frame interior surface, and forming solder over said intermediate regions of said partition plates to thereby mutually attach said partition plates.

13. A method of manufacture according to claim 12, and further comprising a step of executing surface roughening processing of surfaces of said partition plates and said frame interior surface, prior to said step (b) of solder resist film formation.

14. A method of manufacturing a shielded high-frequency apparatus having a partitioned shielding case and a printed circuit board mounted within said partitioned shielding case, comprising steps of:
(a) forming a frame and partition plates from plate metal;
(b) forming a solder resist film over surfaces of said partition plates, with said solder resist film being omitted from specific end regions of said partition plates, forming a solder resist film over at least one ground pattern of said printed circuit board, with said solder resist film being omitted from specific regions of said one ground pattern which are positioned immediately adjacent to the periphery of said printed circuit board, and forming a solder resist film over an interior surface of said frame, with said solder resist film being omitted from a plurality of specific regions of said frame interior surface which are respectively disposed immediately adjacent to said specific end regions of said partition plates and said specific periphery regions of said printed circuit board when said partition plates and printed circuit board are mounted within said frame;
(c) mounting said partition plates within said frame, with said end regions of said partition plates positioned immediately adjacent to respective ones of said specific regions of said frame interior surface;
(d) forming solder over said specific end regions of said partition plates and said specific regions of said frame interior surface corresponding thereto, for thereby attaching said partition plates to said frame interior surface to thereby form said partitioned shielding case; and
(e) placing said printed circuit board within said partitioned shielding case at a predetermined position, and forming solder over said specific periphery regions of said printed circuit board ground pattern and said specific regions of said frame interior surface corresponding thereto, for thereby attaching said printed circuit board to said partitioned shielding case.

15. A method of manufacture according to claim 14, and further comprising a step of executing surface roughening processing of surfaces of said partition plates and said frame interior surface, prior to said step (b) of solder resist film formation.

* * * * *